United States Patent
Ho

(10) Patent No.: US 6,378,110 B1
(45) Date of Patent: Apr. 23, 2002

(54) LAYER-BASED RULE CHECKING FOR AN INTEGRATED CIRCUIT LAYOUT

(75) Inventor: William Wai-Yan Ho, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/053,007

(22) Filed: Mar. 31, 1998

(51) Int. Cl.[7] .................................................. G06F 17/50
(52) U.S. Cl. ............................................................. 716/5
(58) Field of Search .................................. 716/8, 9, 5

(56) References Cited

U.S. PATENT DOCUMENTS 5,781,446 A  *  7/1998  Wu .................................. 716/8

* cited by examiner

Primary Examiner—Matthew Smith
Assistant Examiner—Thuan Do
(74) Attorney, Agent, or Firm—Wagner Murabito & Hao LLP

(57) ABSTRACT

A computer implemented method for verifying a physical layout of an integrated circuit design for a semiconductor chip. The physical layout is specified in terms of a plurality of layers used to fabricate the chip. Initially, a pre-defined set of rules are stored in memory. These rules are used to specify certain dimensions for properly laying out the physical design of the IC. For each rule, one or more layers applicable to that rule is specified. Instead of reading a rule and then applying that rule to the relevant portions of the physical layout, the present invention reads one or more layers pertaining to the physical layout and then determines all rules applicable to those layers. The layers are then verified against the appropriate rules. Any error conditions are stored for subsequent display to the designer or engineer. By performing a layer based rule checking scheme, the number of read operations required, which reduces the time it takes to perform the verification process.

15 Claims, 5 Drawing Sheets

LAYER-BASED RULE CHECKING FOR AN INTEGRATED CIRCUIT LAYOUT

FIELD OF THE INVENTION

The present invention relates to a method and apparatus for verifying the design and layout of an integrated circuit by applying a layer-based rule checking approach.

BACKGROUND OF THE INVENTION

A highly specialized field, commonly referred to as "electronic design automation" (EDA), has evolved to handle the demanding and complicated task of designing and laying out integrated circuit (IC) semiconductor chips. In EDA, computers are extensively used to automate the design and layout process. Computers are ideally suited to performing tasks associated with the design process because computers can be programmed to reduce or decompose large, complicated functional requirements into a multitude of much smaller, simpler functions. Thereupon, the computer can be programmed to iteratively solve these simpler functions to attain a circuit design that would produce the desired results. A physical design tool is then commonly used to place and route the actual logic, physical pinouts, wiring, and interconnects according to the circuit design to produce a physical layout of the semiconductor chip. Indeed, it has now come to the point where the process has become so overwhelming that the next generation of IC chips cannot be designed and laid out without the help of computerized EDA systems.

However, before fabrication on the semiconductor chip begins, extensive testing must be performed to verify and check that the IC has been properly designed and physically laid out. Otherwise, it would be disastrous to find out that new IC chips being used in applications such as computer systems, telecommunications gear, consumer electronics, aviation equipment, medical devices, etc., were subsequently found to be defective. Hence, new designs and layouts are subjected to a host of rigorous testing procedures. One of these procedures calls for checking the physical layout to ensure that it meets certain well-established rules or guidelines. For instance, there may be a rule which stipulates that each of the metal interconnects must be at least of a certain width. If an interconnect is too narrow, it might become prone to breakage (e.g., through electromigration). Another rule might stipulate that two wires must be spaced at least a certain distance apart. If the wires are placed too closely together, the signals being conducted through those wires might interfere with one another or produce unwanted crosstalk. The wires might even, over time, touch and short circuit. Any violations of these established rules indicate a possible point of failure and are indicated to the designer. The designer can then take steps to modify the design and/or layout to correct and prevent fatal flaws in the IC chip.

Today, virtually all layouts are verified by applying a set of established rules to the layout data. The EDA verification software instructs the computer to apply a rule to specific portions of the layout design residing in a database. If that part of the layout meets the rule, then it passes the test. Otherwise, it fails, and the error is duly recorded. The next set of layout data is then read from the database, and the same rule is applied. This process is iteratively performed until all effected portions of the layout design have been tested against that rule. Thereupon, another rule is read. The portions of layout data are then successively read from the database, tested against this new rule, and any errors are recorded. This process repeats until all rules have been so checked against all of the relevant portions of the layout. Afterwards, all recorded errors or rule violations are displayed to the designer.

In the past, when semiconductor chips were simple, the verification process was relatively straightforward and quick. However, advances in semiconductor technology have led the way towards more versatile, powerful, and faster IC chips. The trend is towards even larger, more complex and sophisticated IC chips in an effort to meet and improve upon the demands imposed by state-of-the-art performance. Today, a single IC chip can contain upwards of millions of transistors. As the complexity, functionalities, speed, and size of these chips increase, it is becoming a much more difficult task to properly verify and test the next generation of chips. Furthermore, an increasing number of rules are now being applied to ever larger layouts. The end result is that, what used to take seconds to perform the verification process, can now take hours to perform. In the meantime, engineers and circuit designers must wait for the verification process to complete before they are able to continue working on the chip design. Often, several iterations of the design, layout, and verification process are required in order to optimize the semiconductor chip's size, cost, heat output, speed, power consumption, and electrical functionalities. Consequently, the time it takes to perform the verification process can substantially increase the overall time it takes to finalize the IC chip and bring it to market. Time to market is of critical importance.

Thus, there is a need for some mechanism or method which would reduce the time it takes to perform the verification process. The present invention provides a unique, novel solution which greatly minimizes the time it takes to complete the verification process.

SUMMARY OF THE INVENTION

The present invention pertains to a computer implemented method for verifying the physical layout of new integrated circuit designs for semiconductor chips. Initially, the physical layout is stored in a database as a series of layers. A pre-defined set of rules are also stored. These rules specify certain dimensions and other criteria for checking to determine whether the new design has been properly laid out. The goal is to verify that the new layout design meets all the design rules. For each rule, one or more of the layers applicable to that particular rule is specified. Instead of reading a rule, reading the layout data, and then applying that rule to the layout data, the present invention performs a layer based approach whereby one or more layers are read and then the rules applicable to those layers identified and applied. This approach allows multiple rules to be checked with only a single read operation versus the prior art method which requires one read operation for each rule. Thus the present invention significantly minimizes the number of read operations required, which reduces the time it takes to perform the verification process.

BRIEF DESCRIPTION OF THE DRAWINGS

The operation of this invention can be best visualized by reference to the drawings.

DETAILED DESCRIPTION

A method and apparatus for verifying the design and layout of an integrated circuit by applying a layer-based rule checking approach is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

It has been discovered by the inventor that one of the major bottlenecks in performing the verification process relates to I/O (input/output) operations. Specifically, I/O operations pertain to reading layout data from the database and writing results and/or error conditions back to the database. Typically, the database is stored in one or more mass storage devices, such as hard disk drives, CD-ROM (compact disk, read-only memory) drives, tape drives, optical drives, floppy drives, DVD (digital video disk) drives, etc. Because these mass storage devices contain moving parts, it takes a relatively long time to physically locate the desired data for retrieval. For example, in a hard disk drive, the disk has to be rotated to the correct sector containing the desired data, and the servo actuator has to physically move the transducer to that track before the data can be read. No matter how fast the actual computer is at performing the verification calculations, it must wait for data to be read from the database and then wait while results are being written back to the database. Consequently, I/O operations consume an inordinate amount of time. The present invention significantly minimizes the number of I/O operations that need be performed, thereby greatly reducing the time it takes to perform the verification process.

The present invention is described in comparison with the prior art verification process. First, the prior art verification process is described. Next, the verification process according to the present invention is described in detail. Finally, the differences between the prior art versus the present invention, and the significance of these differences are explained.

Figure 1:
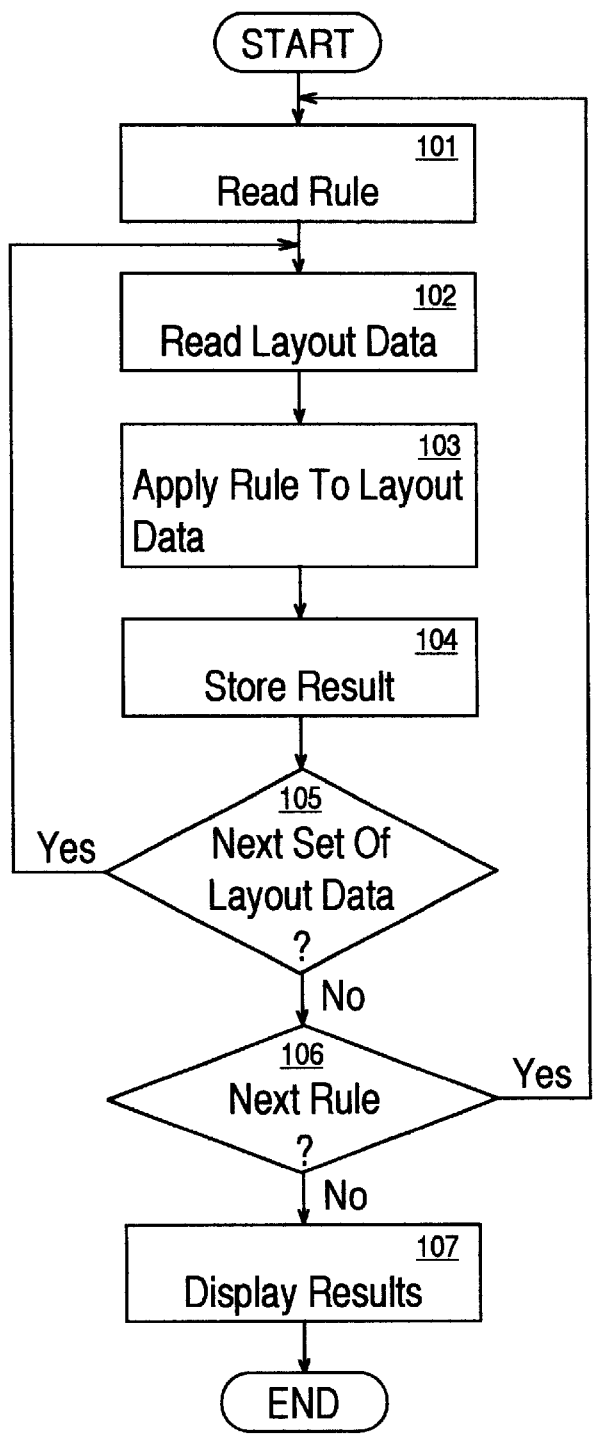
FIG. 1 shows a prior art verification process.

Referring now to FIG. 1, a prior art verification process is shown. First, the computer is instructed to test for one of the rules specified by the EDA verification software, step 101. Next, a portion of the layout data is read from the database, step 102. In step 103, this layout data is then tested to determine whether it meets the conditions set forth in the rule that was specified earlier in step 101. The results (e.g., pass or fail) are then written back to the database or otherwise stored for subsequent display, step 104. The process of steps 102–104 are repeated for the next set of layout data according to step 105. In other words, another set of layout data is read from memory (e.g., a database), verified against the rule, and the results are stored. This process continues until all applicable sets of layout data are tested against that rule. Thereupon, the EDA verification software instructs the computer to test the layout against the next rule, step 106. The process described in steps 102–105 are then repeated for the new rule. This entails successively reading. applicable sets of layout data, verifying the sets of layout data against the new rule, and recording the results. The EDA verification software repeats steps 101–106 until all rules are so tested. Finally, the results are displayed back to the circuit designer or engineer, step 107.

Figure 2:
FIG. 2 shows an example of how the prior art verification process is performed.

FIG. 2 shows an example of the prior art verification process. Suppose that the first rule, step 201, is to check the width of all metal lines in the layout against a minimum critical width (w1). Data relating to the first metal line (m1) would be read from the database, step 202. The width of m1 would be compared against the w1 width specified by the first rule, step 203. If the width of m1 is less than the w1 width, then a violation has occurred. This violation would be recorded, step 204. Next, data relating to another metal line (m2) is read from the database, step 205. The width of m2 is compared against w1, step 206. And the result is then stored in step 207. This process is repeated for a third metal line (m3), steps 208–210. For each of the remaining metal lines (e.g., m3, m4, m5, etc.), layout data needs to be read, metal line widths need to be compared against w1 according to the first rule, and the results need to be stored back to memory.

Next, suppose that there is a second rule which stipulates that the width between two adjacent metal lines must be spaced at least a minimum distance (w2) apart from each other, step 211. This would entail reading the layout data pertaining to the metal 1 and metal 2 lines to determine their positions in order to derive information pertaining to how far apart the two lines are spaced, step 212. The distance separating ml from m2 is compared against w2 as specified by the second rule, step 213. The result of this test is then stored, step 214. Subsequently, the layout data pertaining to the metal 2 and metal 3 lines are read from memory, step 215. This is necessary in order to determine how far apart m2 is from m3. The distance separating m2 from m3 is then compared against w2 according to the second rule, step 216, and the result is stored, step 217. In step 218, the layout data pertaining to the ml and m3 lines are read from memory. The distance separating m1 from m3 is then compared against w2, step 219. The result of this comparison is stored in step 220. The process can be repeated for other sets of metal lines and combinations.

Now, suppose that there is a third rule which checks to verify whether vias are properly centered within their respective metal lines, step 221. A via is used to connect one metal line residing on one of the layers of the IC chip to another metal line residing on a different layer. For example a via (v1) can be used to connect metal 1 line residing on a first layer with the metal 2 line which resides on a different layer. In order to verify that via 1 (v1) is properly centered with respect to the metal 1 line, one must read the layout data corresponding to v1 and m1 to determine their respective locations, step 222. Next, the process checks to determine whether one of the edges of v1 is too close to an edge of m1, step 223. The result is stored in step 224. The same process is repeated for via 1 and the metal 2 line. This is accomplished by reading layout data pertaining to v1 and m2, step 225; applying the third rule, step 226; and storing the result, step 227. Suppose that the metal 3 line is connected to a different via (v2). In order to verify v2 and m3 against the third rule, the layout data pertaining to v2 and m3 must be read from memory, step 228. Thereupon, the third rule is applied to the layout data, step 229, and the result is stored in step 230. The process can continue with different rules. After all rules have been verified, the results are displayed to the human designer or engineer, step 231.

Figure 3:
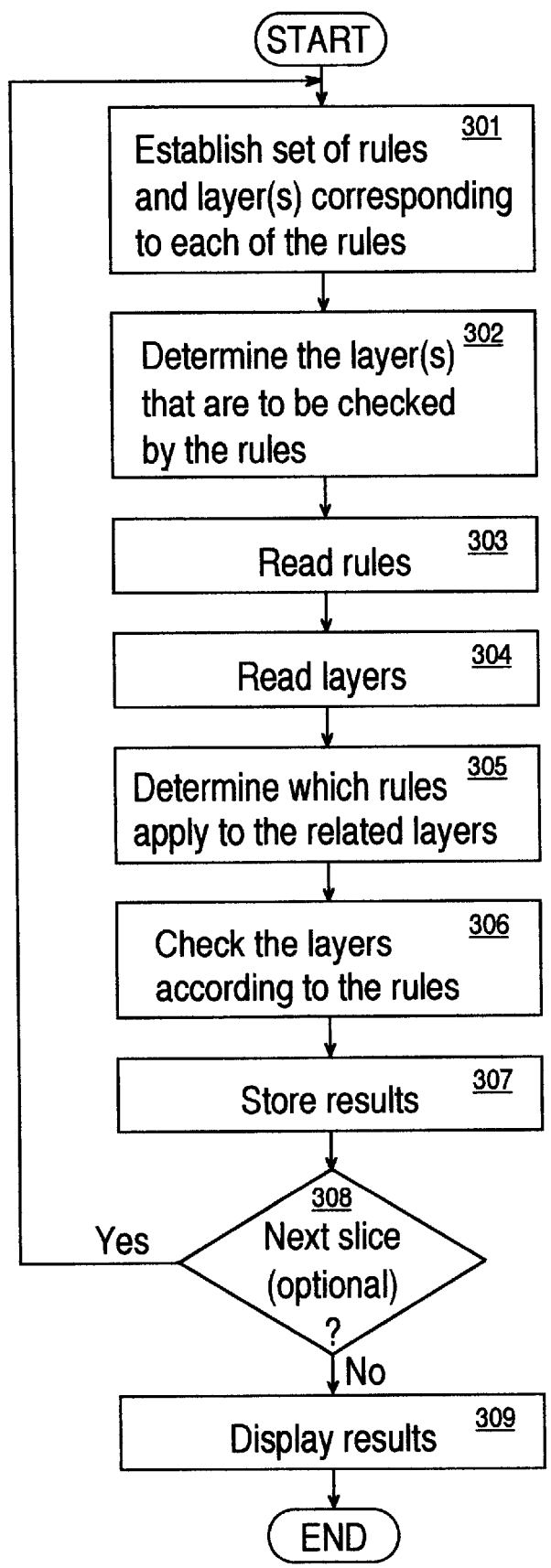
FIG. 3 shows the verification process according to the present invention.

In contrast, FIG. 3 shows the verification process according to the currently preferred embodiment of the present invention. The first step 301 calls for establishing a set of rules for checking the physical layout. The physical layout has a number of layers. These layers correspond to how the semiconductor chip is fabricated. For each of the rules, there is one or more layers corresponding to that particular rule. Different rules may be assigned the same layers. In other words, the same layer data may be needed and used by different rules for checking purposes. This set of rules with corresponding layers information along with the actual physical layout data for each of the layers are stored in memory, usually in some form of a database. Next, the process determines or identifies which of the layers are required in order to execute the rules that need to executed, step 302. Those rules and the applicable layers of layout data are then read from memory, steps 303 and 304. Thereupon, the process determines which of the rules apply to which one(s) of the layer(s), step 305. The layers are then checked according to the associated rules, step 306. Thus, instead of reading the rule(s) and then checking the layer(s), the present invention reads the layer(s) and then checks the rule(s). The results (e.g., pass/no pass) are then stored in memory, step 307. In an optional step, the layers are subdivided into a number of contiguous slices. The process is repeated (steps 301–307) for each individual slice. This is done in order to minimize the amount of local or DRAM memory which is required. Rather than load the entire layers, only a slice of each of the layers is read in at any given iteration. However, as local memory capacity increases and becomes less expensive, the slices can be increased in size and more of each layer is read in per iteration. Ultimately, the entire layout data for all the layers will be read into local memory in one pass and operated upon in one sequence of steps 301–307. Finally, the results of the layer based rule checking process is displayed to the designer or engineer in step 309.

Figure 4:
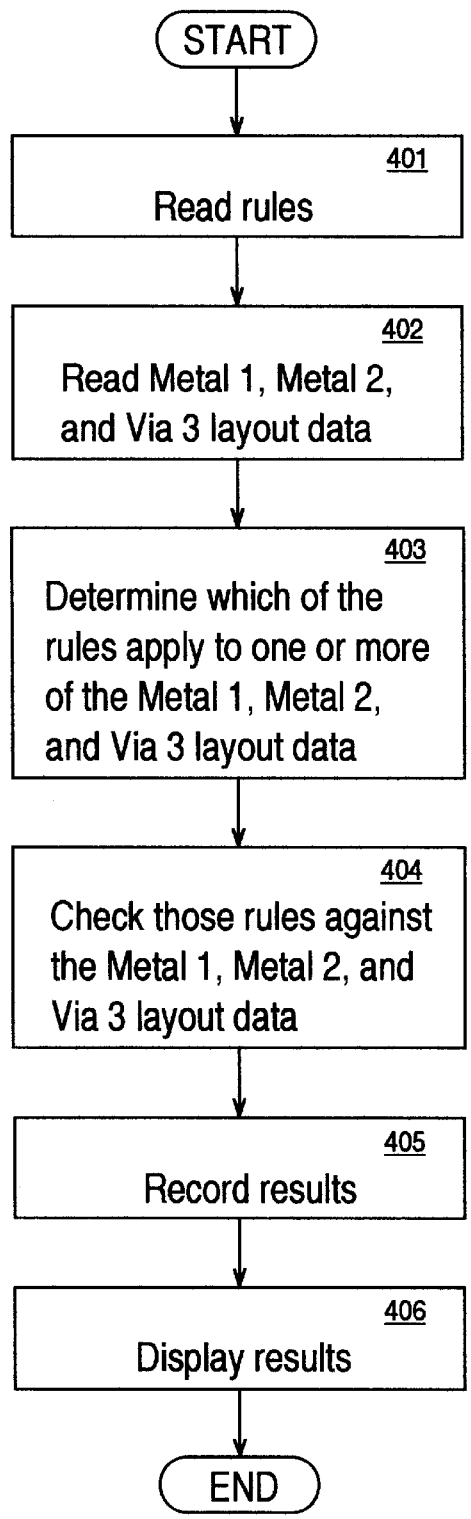
FIG. 4 shows an example of the verification process according to one embodiment of the present invention.

FIG. 4 shows an example of the verification process according to one embodiment of the present invention. Suppose that there are three layers which need to be checked, such as the metal 1 layer, the metal 2 layer, and the via 3 layer. Suppose that there are five rules which apply to these layers: rule 1 applies to the metal 1 layer; rule 2 applies to the metal 1 layer; rule 3 applies to the metal 1 and metal 2 layers; rule 4 applies to the metal 1 and via 3 layers; and rule 5 applies to the metal 1, metal 2, and via 3 layers. Initially, the rules and the layers applicable to the individual rules are read in step 401. The layout data pertaining to the metal 1 layer, the metal 2 layer, and the via 3 layer are also read, step 402. The rules to which the metal 1 layer, the metal 2 layer, and the via 3 layer are determined in step 403. The identified rules are then applied to check the metal 1 layer, the metal 2 layer, and the via 3 layer. For example, the metal 1 layer corresponds to rule 1 and rule 2. Note that the metal 1 layer is read only once, yet two rules have been checked. This minimizes the disk I/O time because the layer data need only be read once, but can be used multiple times by the rules which need that particular layer data. The results are recorded for subsequent display, steps 405 and 406.

There are several advantages offered by the present invention over that of the prior art. Note that the step 102 of reading layout data according to the prior art, resides in a double nested loop. This means that the read function is performed once every cycle in the first loop and then the entire first loop is performed all over again for each and every cycle in the second loop. In contrast, the step of reading layer data according to the present invention, resides within a single step 304. Optionally, layer data can be subdivided into a number of slices, and different layer data can be successively read in slices. In either case, the significance is that the verification process of the present invention has much fewer read operations than that of the prior art. This fact is amply demonstrated by comparing the prior art example shown in FIG. 2 against the example of the present invention depicted in FIG. 4. In the prior art, the process is sequential and requires multiple read operations— one for each of the rules. Whereas in the present invention, one read operation can be used to satisfy multiple rules. Clearly, the present invention accomplishes the same verification results, but with far fewer read operations. The significance is that reads require I/O operations to fetch the data from a mass storage device, which takes a relatively long period of time. By minimizing the number of read operations, the present invention can perform the verification process much quicker than conventional, prior art methods. Furthermore, the speed advantage offered by the present invention becomes even more dramatic as the number of rules to which the layout needs to be verified against increases and as IC chip designs become bigger and more complex. It should be noted that the present invention works with any number of rules and combinations thereof. Hence, the present invention results in much faster verification process. In turn, this means that there is less downtime for designers and engineers, which translates into faster turn-around time for new IC chip designs, faster time-to-market, and reduced costs in bringing the chip to market.

Figure 5:
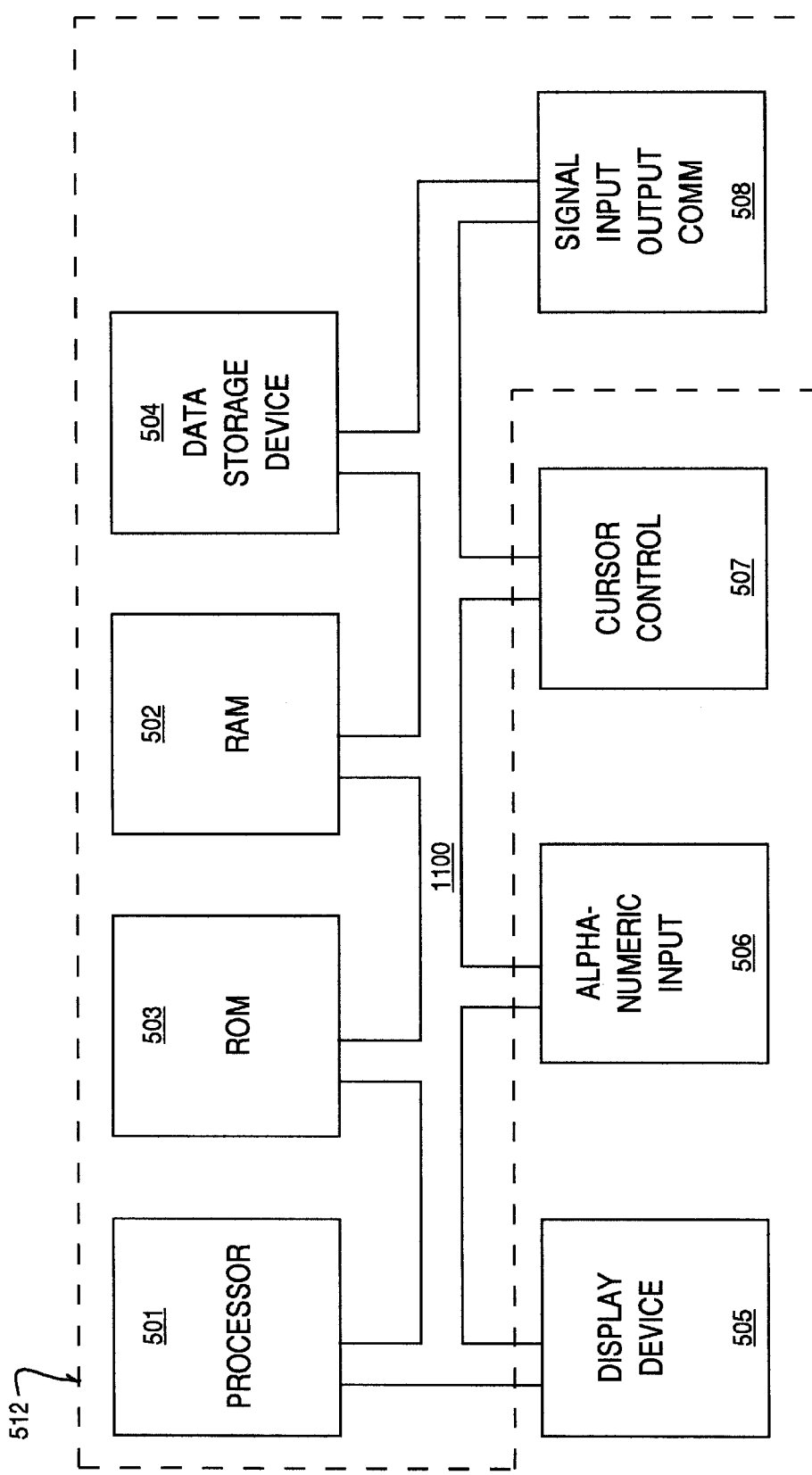
FIG. 5 shows an exemplary computer system upon which the present invention may be practiced.

FIG. 5 shows an exemplary computer system 512 (e.g., personal computer, workstation, mainframe, etc.) upon which the present invention may be practiced. The EDA software for performing the verification process of the present invention is operable within computer system 512. When configured with the verification procedures of the present invention, system 512 becomes a computer aided design (CAD) tool 512, for verification and testing analysis. The steps of the present invention described in FIG. 3 are implemented within system 512.

In general, computer systems 512 used by the preferred embodiment of the present invention comprise a bus 500 for communicating information, a central processor 501 coupled with the bus for processing information and instructions, a computer readable volatile memory 502 (e.g., random access memory) coupled with the bus 500 for storing information and instructions for the central processor 501. A computer readable read only memory (ROM) 503 is also coupled with the bus 500 for storing static information and instructions for the processor 501. A random access memory (RAM) 502 is used to store temporary data and instructions. A data storage device 504 such as a magnetic or optical disk and disk drive coupled with the bus 500 is used for storing information and instructions. A display device 505 coupled to the bus 500 is used for displaying information to the computer user. And an alphanumeric input device 506 including alphanumeric and function keys is coupled to the bus 500 for communicating information and command selections to the central processor 501. A cursor control device 507 is coupled to the bus for communicating user input information and command selections to the central processor 101, and a signal input/output port 508 is coupled to the bus 500 for communicating with a network. The display device 505 of FIG. 5 utilized with the computer system 512 of the present invention may be a liquid crystal device, cathode ray tube, or other display device suitable for creating graphic images and alphanumeric characters recognizable to the user. The results of the verification process are displayed on display device 505. The cursor control device 507 allows the computer user to dynamically signal the two dimensional movement of a visible symbol (pointer) on a display screen of the display device 505 in order to effect changes to the design or otherwise control specifics of the verification process.

Thus, an apparatus and method for performing a layer based rule checking process for verifying an IC design has been disclosed. The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A layer based method for verifying a physical layout of an integrated circuit, comprising the steps of:

storing data pertaining to the physical layout in a database in a plurality of layers;

storing a plurality of rules specifying different criteria for checking the physical layout, wherein the rules have corresponding layers and a plurality of rules are checked against a same read layer;

reading data corresponding to a first layer from the database pertaining to the physical layout;

determining which of the plurality of rules apply to the first layer read from the database;

checking to determine whether the data meet the rules corresponding to the first layer;

reading data corresponding to a second layer from the database pertaining to the physical layout;

determining which of the plurality of rules apply to the second layer read from the database;

checking to determine whether the data meet the rules corresponding to the second layer;

storing a result of the checking step;

displaying the result.

2. The method of claim 1 further comprising the steps of:

subdividing the layer into a plurality of slices;

reading the layers data according to the slices;

verifying the slices meet the rules on a per slice basis.

3. The method of claim 1 further comprising the steps of:

reading a first layer data from the database pertaining to the physical layout;

determining whether a first rule applies to the first layer data;

verifying whether the first layer data meets the first rule only if the first rule applies to the first layer data.

4. The method of claim 3 further comprising the steps of:

determining whether a second rule applies to the first layer data;

verifying whether the first layer data meets the second rule only if the second rule applies to the first layer data.

5. The method of claim 1 further comprising the steps of:

reading a plurality of layers from the database pertaining to the physical layout;

for each layer read from the database, determining all rules pertaining to the layers;

determining the rules which pertain to each of the layers;

verifying whether the rules are met by checking the appropriate layers;

indicating all instances when one of the rules is not met.

6. A computer implemented method of verifying an integrated circuit layout, comprising the steps of:

establishing a set of rules for verifying the integrated circuit layout, wherein a plurality of rules are checked against a same read layer;

storing a plurality of layers of data specifying the integrated circuit layout;

reading a first layer from the memory;

determining which rules apply to the first layer;

checking the first layer against the rules which apply to the first layer;

reading a second layer from the memory;

determining which rules apply to the second layer;

checking the second layer against the rules which apply to the second layer;

storing results of the checking steps.

7. The computer implemented method of claim 6, wherein the rules include checking a width of a line, a spacing distance between two lines; and dimensions corresponding to a via.

8. The computer implemented method of claim 6, wherein the layers are read one slice per iteration.

9. A computer-readable medium having stored thereon instructions for causing a computer to implement a verification process comprising the steps of:

a) storing a pre-defined set of rules which specifies a plurality of criteria pertaining to dimensions, wherein each of the rules has a corresponding layer and a plurality of rules are checked against a same read layer;

b) storing data pertaining to a plurality of layers of the integrated circuit layout in a memory;

c) reading one or more layers from the memory;

d) determining which particular rules of the set of rules apply to the layers read in step c;

e) applying the particular rules determined in step d to the layers read in step c to determine whether there is any error;

f) storing any error identified in step e.

10. The computer implemented method of claim 9, wherein the criteria include a width of a line, a spacing distance between two lines; and dimensions corresponding to a via.

11. The computer implemented method of claim 9 further comprising the step of subdividing the layers into a plurality of slices, wherein a slice from each of the layers is read and verified according to the rules.

12. A computer system for verifying a physical layout of an integrated circuit, comprising:

a storage device for storing data pertaining to a plurality of layers of the physical layout, rules for verifying the physical layout, and information;

a processor coupled to the storage device for reading a plurality of rules specifying different criteria for checking the physical layout, reading a first set of layers from the database pertaining to the physical layout, determining rules which apply to the layers, checking a plurality of rules against a same read layer and verifying whether the layers meet the rules;

a display device coupled to the processor for displaying results of the verification process.

13. The computer system of claim 12, wherein the processor reads the layers on a slice basis.

14. The computer system of claim 12, wherein the processor reads a first layer from the database pertaining to the physical layout, determines whether a first rule applies to the first layer, verifies whether the first layer meets the first rule only if the first rule applies to the first layer, and stores a result of the verification pertaining to the first rule and the first layer.

15. The computer system of claim 14, wherein the processor determines whether a second rule applies to the first layer, verifies whether the first layer meets the second rule only if the second rule applies to the first layer, and stores a result of the verification pertaining to the second rule and the first layer.

* * * * *